United States Patent [19]

Magome et al.

[11] Patent Number: 5,075,887
[45] Date of Patent: Dec. 24, 1991

[54] SEMICONDUCTOR MEMORY CAPABLE OF IMPROVING DATA REWRITE SPEED

[75] Inventors: Koichi Magome, Kawasaki; Masakazu Kiryu, Yokosuka; Shigeo Ohshima, Tokyo; Haruki Toda, Yokohama; Hiroshi Sahara, Tokyo, all of Japan

[73] Assignee: Kabushiki Kaisha Toshiba, Kawasaki, Japan

[21] Appl. No.: 647,202

[22] Filed: Jan. 28, 1991

Related U.S. Application Data

[63] Continuation of Ser. No. 284,526, Dec. 15, 1988, abandoned.

[30] Foreign Application Priority Data

Dec. 21, 1987 [JP] Japan ............................. 62-323083
Jan. 7, 1988 [JP] Japan ............................. 63-1653

[51] Int. Cl.$^5$ ...................... G11C 7/00; G11C 11/419
[52] U.S. Cl. ............................. 365/222; 365/189.01
[58] Field of Search ............ 365/222, 203, 189.01, 365/218, 189.04

[56] References Cited

U.S. PATENT DOCUMENTS

| | | | |
|---|---|---|---|
| 4,439,843 | 3/1984 | Takamatsu | 365/218 |
| 4,567,578 | 1/1986 | Cohen et al. | 365/218 X |
| 4,581,720 | 4/1986 | Takemae et al. | 365/222 |
| 4,739,500 | 4/1988 | Miyamoto et al. | 365/222 X |
| 4,789,967 | 12/1988 | Liou et al. | 365/218 |
| 4,829,484 | 5/1989 | Arimoto et al. | 365/222 |
| 4,837,746 | 6/1989 | Banerjee et al. | 365/222 X |
| 4,847,809 | 7/1989 | Suzuki | 365/189.04 |
| 4,907,199 | 3/1990 | Dosaka et al. | 365/222 X |

FOREIGN PATENT DOCUMENTS

62-121997 6/1987 Japan .
62-184693 8/1987 Japan .

Primary Examiner—Alyssa H. Bowler
Attorney, Agent, or Firm—Finnegan, Henderson, Farabow, Garrett, and Dunner

[57] ABSTRACT

A semiconductor memory device is disclosed which comprises, as shown in FIG. 1, a pair of column lines, memory cells connected to the corresponding column lines, a sense amplifier connected to the column lines, row lines for selecting the memory cells in accordance with a row address signal, and first and second transistors having their current paths connected between the column lines and a fixed potential supply terminal supplied with a positive power source potential or a ground potential, wherein the gates of the first and second transistors are connected to the first and second row lines for a data rewrite operation which can be selected independently of the row line.

10 Claims, 6 Drawing Sheets

SEMICONDUCTOR MEMORY CAPABLE OF IMPROVING DATA REWRITE SPEED

This application is a continuation of application Ser. No. 07/284,526, filed Dec. 15, 1988 now abandoned.

BACKGROUND OF THE INVENTION

1. Field of the Invention

The present invention relates principally to a semiconductor memory device and, in particular, a semiconductor memory device, such as an image memory device, for allowing data to be rewritten at high speed into memory cells.

2. Description of the Related Art

As an image memory device of this type, a dual port memory device has widely been employed which includes a random access memory (RAM) for allowing data access to be gained to any address and serial access memory (SAM) for allowing data to be accessed in a serial fashion. The general way of using the dual port memory is to enable an image display to be made by allowing data which are written into cells on a given row in RAM to be transferred to SAM and the data which are so transferred to be output from SAM in a serial fashion. It is necessary that, if all image data are to be cleared at once for a short period of time, all the data transferred from RAM to SAM be set to the same contents, that is, "1s" or "0s". In other words, it is necessary that all the data which are randomly stored as a varying combination of "1s" or "0s" on a given row of RAM be rewritten as the same data at one time.

Figure 3:
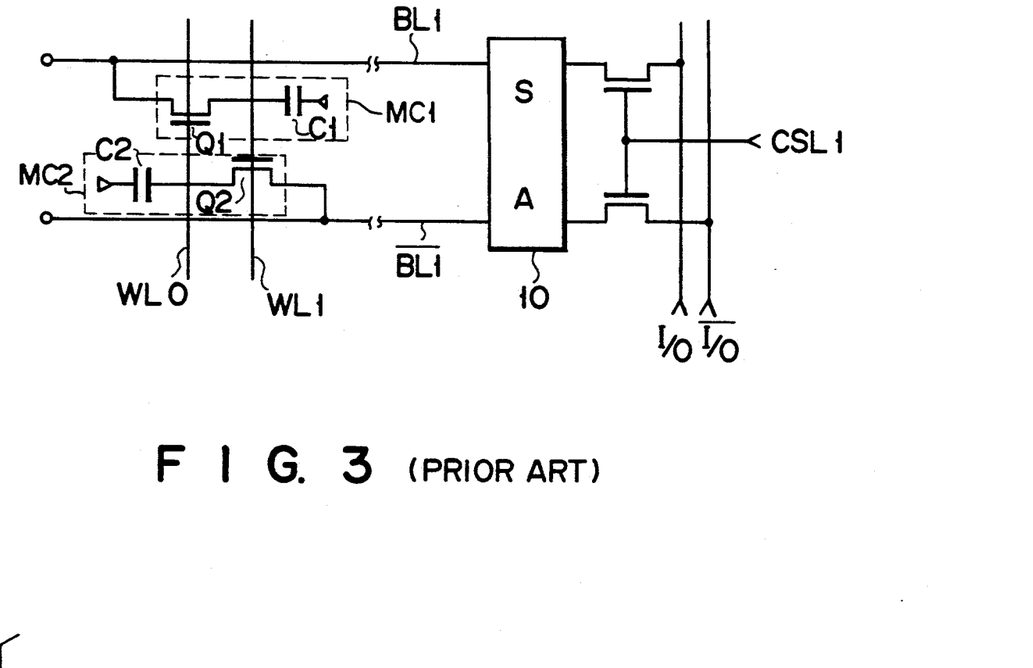
FIG. 3 is a circuit diagram showing a conventional semiconductor memory device.

In a memory array of a conventional RAM as shown in FIG. 3, a page mode is usually employed to allow cell data on a given row to be rewritten all as the same contents.

Figure 4:
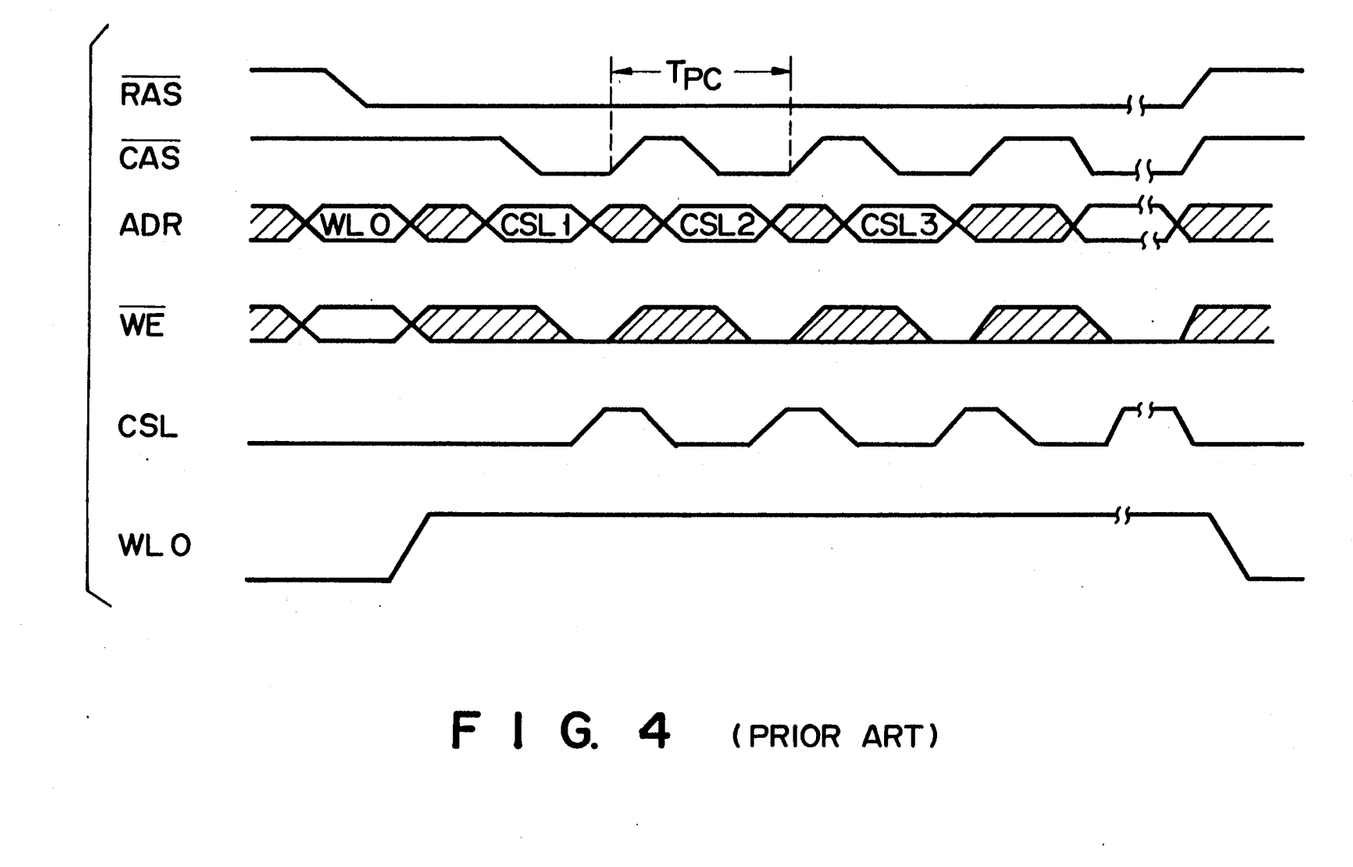
FIGS. 4 and 5 are a timing charts for explaining data rewrite operation on the conventional semiconductor memory device.

As appreciated from the timing chart of FIG. 4, with a row address strobe signal $\overline{RAS}$ at a low level, a given row in RAM is selected to enable, for example, a row line $WL_0$. Then the column of RAM is sequentially selected by a column address strobe signal $\overline{CAS}$. Upon enabling, for example, a column select signal $CSL_1$ by an address ADR, the data which is output from an I/O buffer is written into memory cell $MC_1$ via column line $BL_1$. In the page mode, the columns are sequentially selected to allow data to be written column by column into all those cells associated with the row line $WL_0$.

Figure 5:
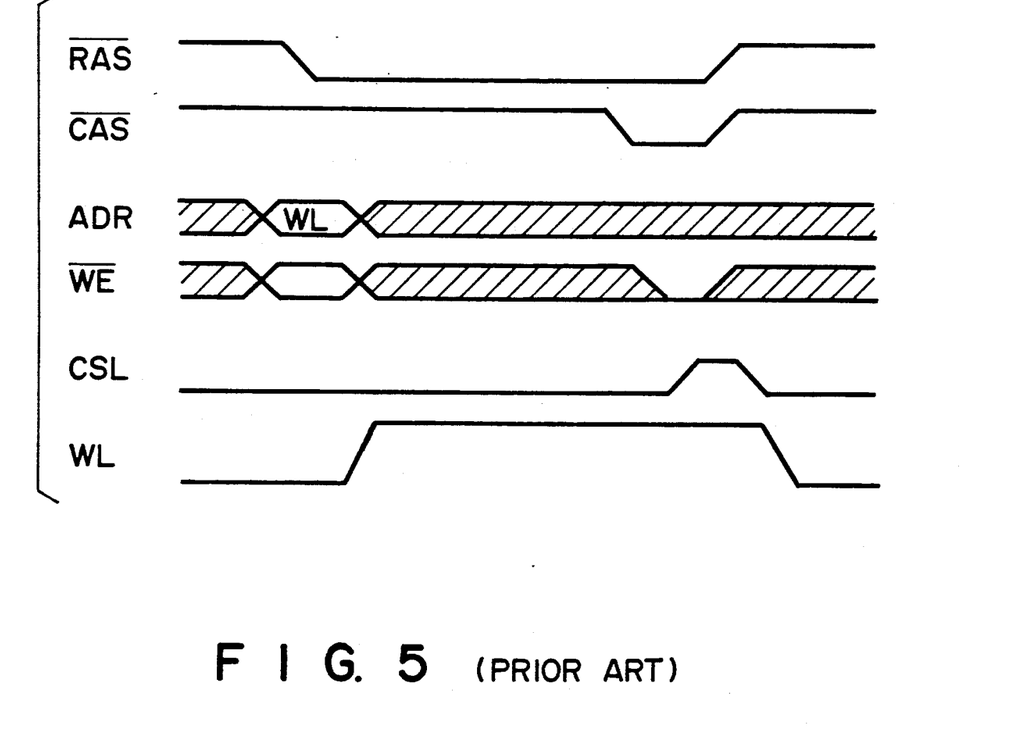

This method is effective because it directly uses the RAM function. However, it takes too long to rewrite RAM data as set forth above. That is, according to this method a time $Cn \times Tpc$ is required in rewriting data on a given row, where Cn: the number of columns in a memory array and
Tpc: the page mode cycle time A data rewriting system also may be employed to obtain those cell data on the row as all "0s" or all "1s" at one time instead of writing data column by column as in a page mode. This system may be used in an ordinary RAM, such as the memory array of the type shown in FIG. 3, in which case the operation timing is as shown in FIG. 5. That is, the system is of such a type that, subsequent to selecting a row in accordance with the row address with a row address strobe signal $\overline{RAS}$ set to a low level, each column is selected irrespective of the row address and then data "1s" or "0s" are caused to be written from an I/O buffer into all the cells which are connected to one row.

By the use of this system all the cell data on the row which are associated with an ordinary $\overline{RAS}$ cycle time can be set to the same level and data write operation can be achieved at high speed on that system. However, this system encounters a problem as set forth above.

Where use is made of a system capable of writing all associated data into those cells on a given row at one time, a write-in buffer of a greater capability is required to prevent an error upon the write-in of data. As a result, that buffer becomes very large in size. Furthermore, at the write time a fairly large current temporarily flows, causing a power source-induced noise. It is difficult to combat the aforementioned noise problem.

SUMMARY OF THE INVENTION

It is accordingly the object of the present invention to provide a semiconductor memory device, such as a semiconductor image memory device, which rewrites the data of memory cells all at one time for simultaneous clearing of images.

Figure 1:
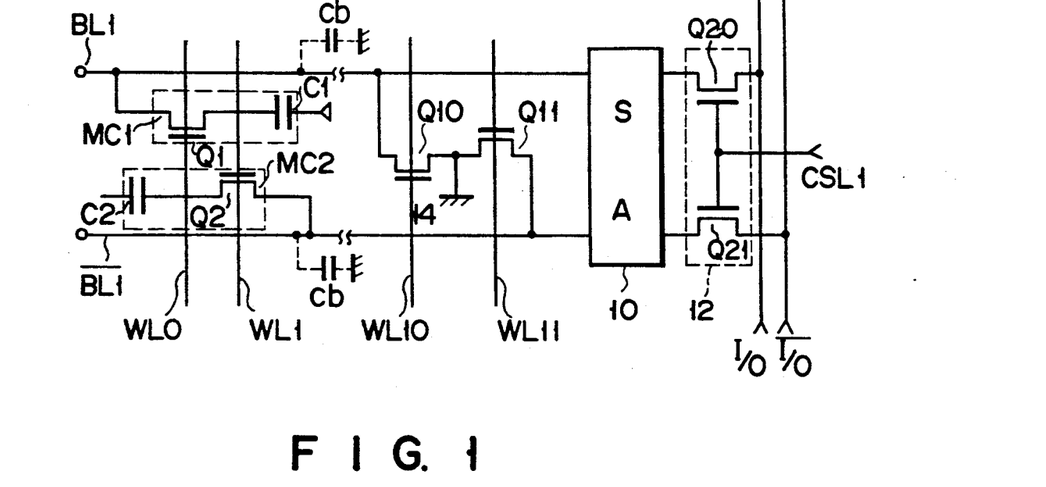
FIG. 1 is a circuit diagram showing a semiconductor memory device according to one embodiment of the present invention.

According to the present invention, a semiconductor memory device is provided which, as shown in FIG. 1, comprises a pair of column lines $BL_1$, $BL_1$, memory cells $MC_1$, $MC_2$ connected to the column lines, switching transistors $Q_1$, $Q_2$ having their conductive paths opened and closed, row lines $WL_0$, $WL_1$ for selecting the memory cells in accordance with a row address signal, and first and second transistors $Q_{10}$ and $Q_{11}$ having their current paths connected between the column lines and a fixed potential supply terminal 14, which is supplied with a positive power source potential or a ground terminal, in which first and second data rewrite row lines $WL_{10}$ and $WL_{11}$ are connected to the gates of the first and second transistors and can be selected independently of the row lines and a sense amplifier 10 is provided which is connected to the column lines.

In the semiconductor memory device, the potential on the column line can be set to a low or a high level by selecting the data rewrite row lines. By so doing, the same data can be written into the memory cells on a selected row all at one time without the need of forcedly writing data via a write-in buffer into the memory cells. Such a write method is called "a flash write".

As a result, the semiconductor memory device of the present invention can set image data to an initial state all at one time without the need of providing any bulky buffer of larger capacity, as encountered in the conventional semiconductor memory device and without involving a power source noise induced at the time of writing.

DETAILED DESCRIPTION OF THE PREFERRED EMBODIMENTS

The embodiments of the present invention will be explained below with reference to the accompanying drawings.

In the semiconductor memory device shown in FIG. 1, circuit elements on one column are shown for the sak of brevity, noting that the other columns have the same configuration as that of FIG. 1.

That is, as in the conventional semiconductor memory device of FIG. 3, memory cells $MC_1$ and $MC_2$ to be selected by row lines ($WL_0$ and $WL_1$), respectively, as well as N-channel MOS transistors $Q_{10}$ and $Q_{11}$ for data rewrite operation, are connected to column lines (a pair) $BL_1$ and $\overline{BL}_1$, respectively, in the semiconductor memory device.

Memory cell $MC_1$ is constituted by N-channel MOS transistor $Q_1$ connected at its gate to row line $WL_0$ and capacitor $C_1$. Memory cell $MC_2$ is constituted by N-channel MOS transistor $Q_2$ connected at its gate to row line $WL_1$ and capacitor $C_2$.

N-channel MOS transistor $Q_{10}$ for data rewrite operation is connected, at its current path, between column line $BL_1$ and a ground terminal or a positive power source terminal and, at its gate, to row line $WL_{10}$, which is provided for data rewrite operation. N-channel MOS transistor $Q_{11}$ is connected, at its current path, between column line $\overline{BL}_1$ and a ground terminal and at its gate to row line $WL_{11}$. Row lines $WL_{10}$ and $WL_{11}$ can be selected independently of row lines $WL_0$ and $WL_1$, which select those associated memory cells.

For the other columns, two N-channel MOS transistors for data rewrite operation are connected in the same fashion as set forth above, with row lines $WL_{10}$ and $WL_{11}$ connected in a similar way.

The pair of column lines $BL_1$ and $\overline{BL}_1$ are connected to common data line I/O, $\overline{IO}$ via sense amplifier 10 and column select circuit 12. Column select circuit 12 is constituted by N-channel MOS transistors $Q_{20}$ and $Q_{21}$ and switching controlled by column select signal CSL which is enabled in accordance with the contents of the column address.

Figure 2:
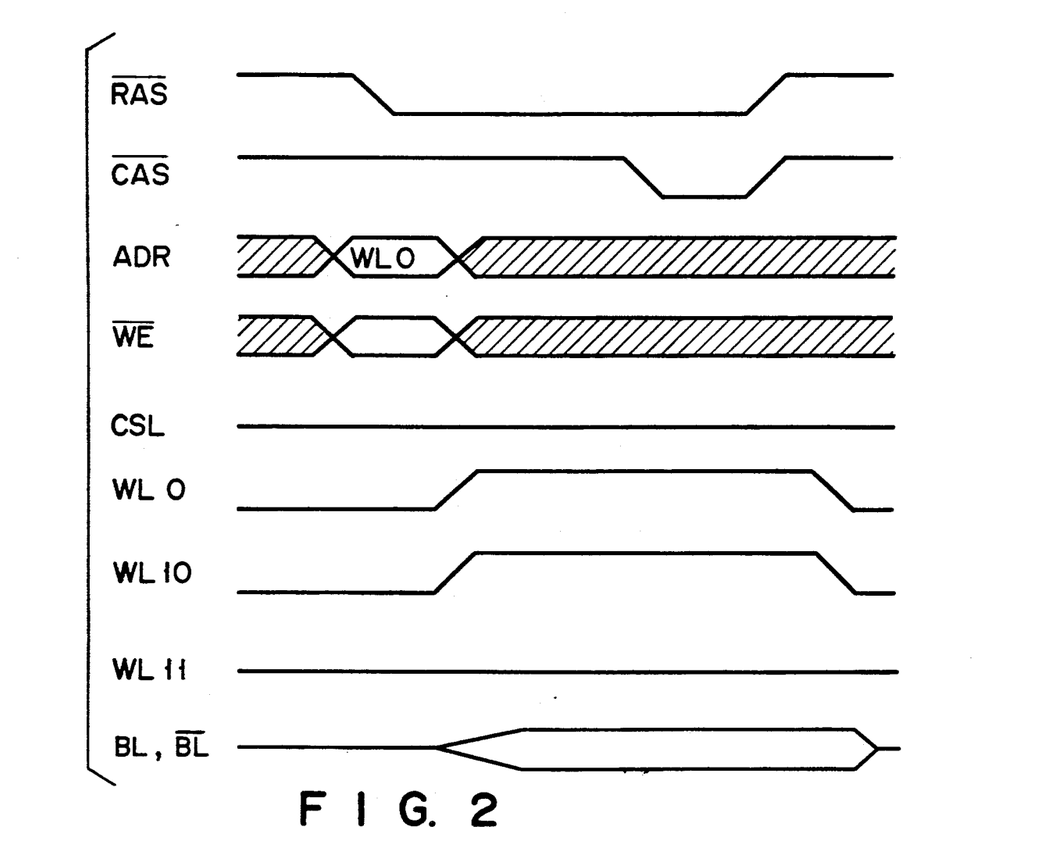
FIG. 2 is a timing chart for explaining a data rewrite operation on the semiconductor memory device shown in FIG. 1.

The data rewrite operation of the semiconductor memory device (FIG. 1) will be explained below with reference to the timing chart shown in FIG. 2. Let it be assumed that 14 denotes a ground potential.

The circuit operation will be explained below in connection with writing "0" data into memory cells on each column which is connected to row line $WL_0$. First with the row address strobe signal $\overline{RAS}$ set to a low level the corresponding row address is taken up. This is an ordinary operation. If the flash write mode is selected at the $\overline{WE}$ state upon the fall of the strobe signal $\overline{RAS}$, row line WL10 is also selected until sense amplifier 10 is operated. As a result, transistors $Q_1$ and $Q_{10}$ are rendered conductive. The potential on column BL is determined by the capacitance of capacitor $C_1$, capacitance $C_b$ on column line $BL_1$ and the drive capability of transistor $Q_{10}$. Where, for example, data "1" is being stored in the memory cell $MC_1$ with a charge accumulated on capacitor $C_1$, unless transistor $Q_{10}$ is rendered conductive, the potential on column line $BL_1$ becomes higher than a precharging potential, that is, a level involved before the enabling of row line $WL_0$. If, however, at the time of selecting row line $WL_0$, row line $WL_{10}$ is also selected to place transistor $Q_{10}$ in the conductive state, then the charge which is accumulated on capacitor $C_1$ is discharged into a ground terminal via column line $BL_1$ and transistor $Q_{10}$, so that the potential on column line $BL_1$ becomes smaller in level than the potential involved at the precharging time. When, in this state, sense amplifier 10 is driven, column line $BL_1$ and $\overline{BL}_1$ can be set to the low and high potential levels, respectively. The row address strobe signal $\overline{RAS}$ being placed back in the high voltage level, both row lines $WL_0$ and $WL_{10}$ are rendered in the non-selective state to allow data "0" to be written into memory cell $MC_1$. Similarly, data "0" is written into memory cells on the respective row line, all at one time, which are connected to row line $WL_0$.

Although the invention has been explained as writing data "0" into all the memory cells on the respective row line at one time, it can equally be applied to the case where, if associated cell data are "0", data "0" are rewritten onto these cells on the associated row.

Where, on the other hand, data "1" is written into memory cell $MC_1$, row lines $WL_0$ and $WL_{11}$ need only to be selected simultaneously. Data "0" being stored in memory cell $MC_1$, the potential on column line $BL_1$ is dropped, upon the selection of row line $WL_0$, down to a predetermined level which is determined by a capacitance division at the location of memory cell $MC_1$ and column line $BL_1$. Since, however, row line $WL_{11}$ is enabled, transistor $Q_{11}$ is turned ON, causing column line $\overline{BL}_1$ to be placed at a lower level than that at column line $BL_1$. Upon the subsequent driving of sense amplifier 10, column lines $BL_1$ and $\overline{BL}_1$ are placed at the high and low potential level, respectively. It is, therefore, possible to write "1" into memory cell $MC_1$. Data "1" being initially stored in memory cell $MC_1$, needless to say, the rewriting of data "1" can further be facilitated.

Although an explanation has been made in connection with memory cell $MC_1$ on the column line $BL_1$ side, the same thing can also be true of the memory cell, such as $MC_2$, on the column line $\overline{BL}_1$ side.

In the memory device of the present invention as set forth above, the same data can be rewritten into all cells on any row, at one time, during an ordinary RAS cycle. Since the present semiconductor memory device is not of such a type that data is not forcedly rewritten into the memory cells from a write-in buffer, the current drive capability of that buffer need not be set to an unnecessarily great extent. It is possible, according to the present invention, to perform a data rewrite operation at high speed without involving the aforementioned power source-induced noise, bulkiness of the write-in buffer, and so on.

In the normal data write operation, the normal row lines have only to be selected without selecting the data rewrite row lines $WL_{10}$ and $WL_{11}$. A similar data rewrite operation can be performed even in the case where one terminal 14 of the data rewrite transistor is connected to a positive power source terminal instead of being connected to the ground terminal. In this case, however, the contents of the rewrite data are opposite to those set out above, upon the selection of row lines $WL_{10}$ and $WL_{11}$.

Figure 6:
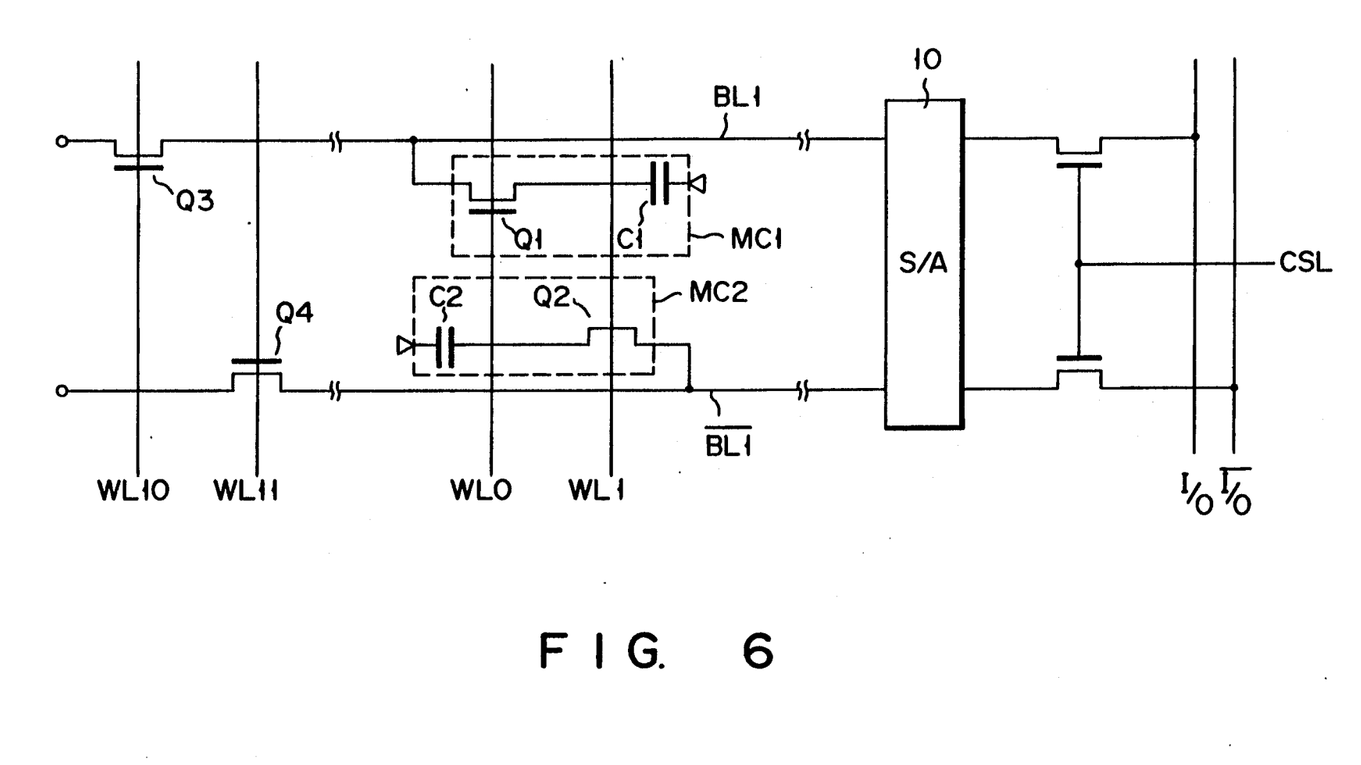
FIG. 6 is a circuit diagram, different from that in FIG. 1, showing a semiconductor memory device according to another embodiment of the present invention.
Figure 7:
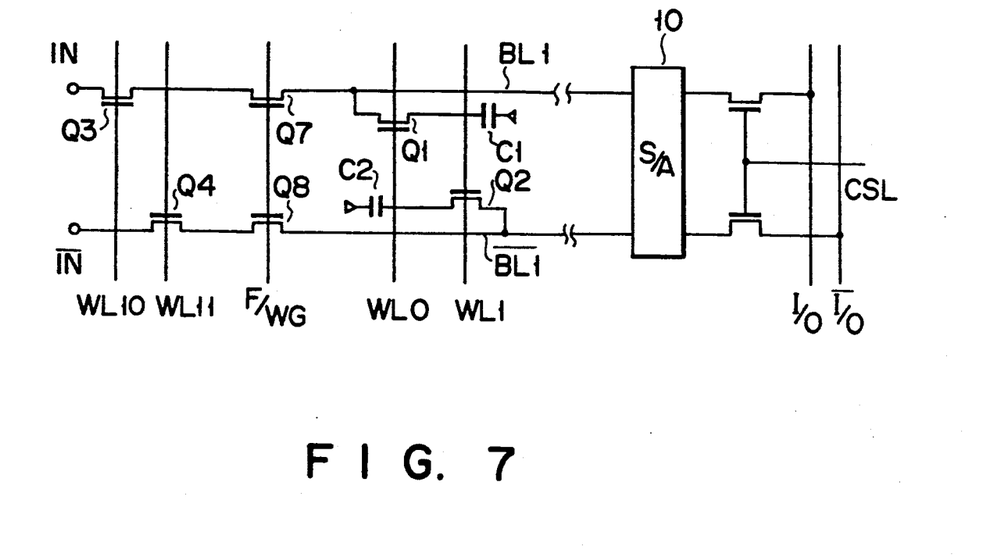
FIG. 7 is a circuit diagram showing another embodiment of the present invention.
Figure 8:
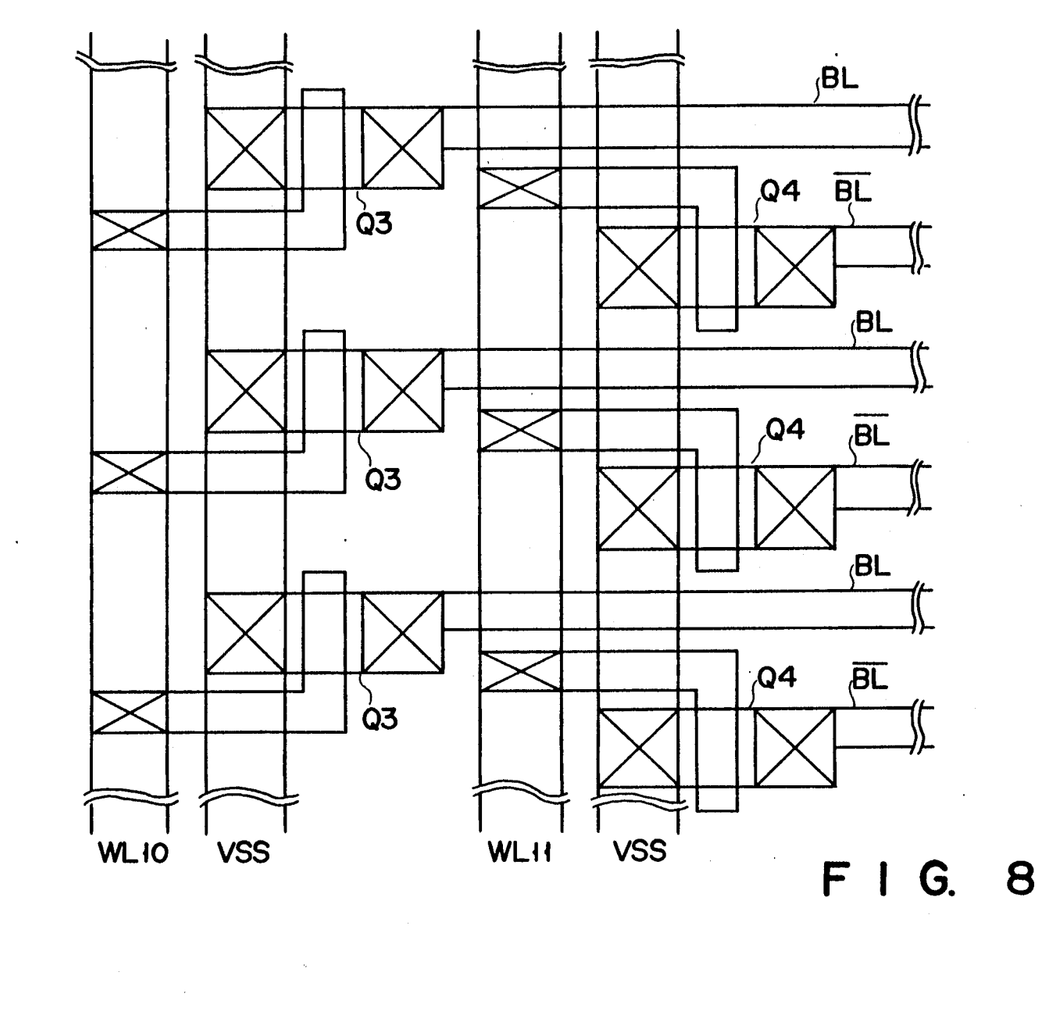
FIG. 8 is a pattern concept diagram showing the circuit diagram in an IC form.

As one practical application, first and second row lines $WL_{10}$ and $WL_{11}$ for data rewrite operation are employed, as shown in FIGS. 6 and 8, in a revised circuit pattern of the conventional memory device. As shown in FIG. 8, the addition of the aforementioned data write-only lines to the revised memory device results in column lines BL and $\overline{BL}$ of a different length and hence in an unbalanced static capacitance relative to the respective column lines. This causes a poor margin in terms of the detection function of sense amplifier 10. This is an ordinary operation. If the flash write mode is selected at the $\overline{WE}$ state upon the fall of the strobe signal $\overline{RAS}$, row line WL10 is also selected until sense amplifier 10 is operated. As shown in FIG. 7, therefore, switching transistors $Q_7$ and $Q_8$ are inserted partway between the column lines and the fixed data write-only lines and, except in the case where the fixed data are flash-written with the use of the aforementioned row lines, the aforementioned transistors are turned OFF so as to prevent a possible unbalanced static capacitance relative to the respective column lines By so doing, the degradation of the "sense margin" is improved. In this connection it is to be noted that the aforementioned transistors thus inserted are of a MOS type and that the write data supply terminals are grounded or connected to a positive power terminal. As shown in FIG. 8, a buffer A may be connected to data input terminal to receive an input signal.

Figure 9:
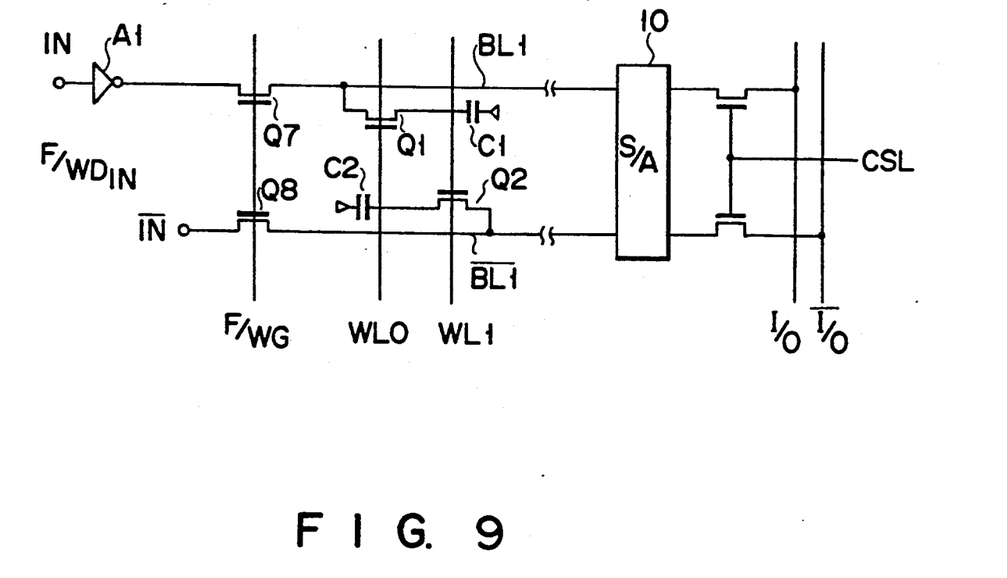
FIG. 9 is a circuit diagram showing another embodiment of the present invention.

As shown in FIG. 9, a signal line F/WG which is connected to the gates, and shared between transistors $Q_7$ and $Q_8$, receives a gate input signal at the flashwrite time and is selected at the time of a flash-write mode immediately subsequent to the selection of the row line. The signal line F/WG serves to provide a drive signal for WG data transfer to the aforementioned switching transistors.

In connection with FIG. 9, an explanation will be given of how to write "1" data into all cells on row line $WL_0$. The data to be written there is determined prior to the start of the write-in cycle. In this case, the inverter input signal $F/WD_{IN}$ goes low because data "1" is written into associated cells. Row line $WL_0$ is selected in this case. Before the drive of sense amplifier 10, signal F/WG goes high and a potential on column line BL is raised due to the drive capability of inverter $A_1$. Thereafter, sense amplifier 10 is driven so that the potential on the column line is determined. The potential on the column line naturally becomes equal to the power source potential and selected row line $WL_0$ is placed in the non-selected state. Data "1" is written into the corresponding cell capacitance C1.

Where the data "0" is to be written into all cells on a row line at one time, an input signal $F/WD_{IN}$ to inverter $A_1$ goes high so that the aforementioned write operation can be achieved.

According to the present invention a semiconductor memory device, such as an image memory device in particular, is obtained which can rewrite data at high speed without involving a power source-induced noise as well as the bulkiness of the write-in buffer.

What is claimed is:

1. A semiconductor memory device comprising:
    first and second column lines (BL, $\overline{BL}$);
    a plurality of memory cells (C1, Q1, C2, Q2) connected to said column lines;
    a sense amplifier (SA) connected to said column lines;
    row lines (WL0, WL1) for selecting the memory cells in accordance with a row address signal; and
    first and second transistors (Q3, Q4) connected at their current paths between said pair of column lines and a fixed potential supply terminal supplied with a positive power source potential or ground potential;
    wherein said first and second transistors are connected at their gates to first and second data rewrite row lines which can be selected independently of said row lines, such that said first and second transistors are operated independently by first and second timing control signals which are respectively input to said first and second transistors, and wherein said plurality of memory cells are formed between said sense amplifier and said first and second transistors.

2. The semiconductor memory device according to claim 1, wherein said memory cells each comprises one transistor and one capacitor.

3. A semiconductor memory device according to claim 1, further comprising third and fourth transistors (Q7, Q8);
    wherein said third transistor (Q7) is connected to said first column line (BL), and interposed between said sense amplifier (SA) and said first transistor (Q3);
    said fourth transistor (Q8) is connected to said second column line ($\overline{BL}$), and interposed between said sense amplifier (SA) and said second transistor (Q4);
    the length of said first column line between said third transistor (Q7) and said means amplifier (SA) is equal to that of said second column line between said fourth transistor (Q8) and said sense amplifier (SA);
    said third and fourth transistors are further connected to data supply terminals (IN, $\overline{IN}$); and
    said third and fourth transistors are in an on-state while data signals are being input from said data supply terminals (IN, $\overline{IN}$), and are in an off-state while no signals are input from the same.

4. The semiconductor memory device according to claim 3, wherein said memory cells each comprises one transistor and one capacitor.

5. The semiconductor memory device according to claim 3, wherein said data supply terminals are grounded or connected to a positive power source terminal.

6. The semiconductor memory device according to claim 3, wherein one of said data supply terminals is connected to said switching transistors via an inverter which is supplied with input write data and the other data supply terminal is placed in an electrically floated state.

7. The semiconductor memory device according to claim 3, wherein a common signal line is connected to the switching transistors.

8. The semiconductor memory device according to claim 7, wherein when said common signal line becomes a predetermined level subsequent to the selection of said column and row lines and a potential on said column line becomes a predetermined level, said sense amplifier sets said potential on said column line to a predetermined level to allow predetermined data "0" or "1" to be written into said cells.

9. The semiconductor memory device according to claim 3, further comprising a buffer which, upon receipt of an input signal of a predetermined level, writes predetermined data "0" or "1" into all cells on said row line at one time.

10. A semiconductor device having a fixed potential supply terminal for connection to a positive power source potential or a ground potential, and receiving first and second timing control signals and a row address signal, the semiconductor device comprising:

first and second column lines (BL, $\overline{BL}$);

a plurality of memory cells (C1, Q1, C2, Q2) connected to the column lines;

a sense amplifier (SA) connected to the column lines;

normal row lines (WL0, WL1) for selecting the memory cells in accordance with the row address signal;

first and second transistors, each having a current path, and being connected at their current paths between the first and second column lines and the fixed potential supply terminal, each receiving a respective one of the first and second timing control signals; and first and second data rewrite row lines respectively connected to the gates of the first and second transistors and responsive to the first and second timing control signals for selection independently of the normal row lines;

the plurality of memory cells being between the sense amplifier and the first and second transistors.

* * * * *